United States Patent [19]

Pasquinelli

[11] Patent Number: 4,481,628
[45] Date of Patent: Nov. 6, 1984

[54] APPARATUS FOR TESTING DYNAMIC NOISE IMMUNITY OF DIGITAL INTEGRATED CIRCUITS

[75] Inventor: Rossano Pasquinelli, Sesto S. Giovanni, Italy

[73] Assignee: Honeywell Information Systems Inc., Waltham, Mass.

[21] Appl. No.: 422,622

[22] Filed: Sep. 24, 1982

[30] Foreign Application Priority Data

Dec. 15, 1981 [IT] Italy ............................... 25597 A/81

[51] Int. Cl.³ ............................................. G01R 31/28
[52] U.S. Cl. ................................. 371/28; 324/73 R; 371/64
[58] Field of Search ............................. 371/28, 64, 25; 324/73 R, 73 PC

[56] References Cited

U.S. PATENT DOCUMENTS 3,541,441 11/1970 Hrustich ........................... 371/28 X
3,548,176 12/1970 Shutler .............................. 371/64 X
3,573,445 4/1971 Korytnaja et al. ................... 371/15
4,125,764 11/1978 Chambers et al. ................... 371/28

Primary Examiner—Charles E. Atkinson
Attorney, Agent, or Firm—William A. Linnell; Nicholas Prasinos

[57] ABSTRACT

Apparatus for testing dynamic noise immunity of digital integrated circuits wherein noise pulses of predetermined duration and amplitude are applied to the inputs of an integrated circuit under test. The tested circuit outputs which normally are at logic level 0 are connected to the inputs of a first group of control logic gates, while the tested circuit outputs which normally are at logic level 1 are connected to the inputs of a second group of control logic gates. The outputs of such groups feed a fault detection circuit. The input voltage thresholds of control logic gates is adjusted by suitable circuits so as to check the dynamic noise immunity of the integrated circuit under test for a predetermined logic swing.

3 Claims, 6 Drawing Figures

APPARATUS FOR TESTING DYNAMIC NOISE IMMUNITY OF DIGITAL INTEGRATED CIRCUITS

BACKGROUND OF THE INVENTION

1. Field of the Invention

The present invention relates to the apparatuses for testing digital integrated circuits and, more particularly, to the apparatuses for testing the dynamic noise immunity of such circuits.

2. Description of the Prior Art

It is known that electromagnetic noise may affect the behavior of a logic system because it adds to the voltage levels present on the input of the gate constituting such system and may alter the output of some logic gates. A distinction between two types of noise is required: the former generated outside the logic system (for instance, due to high frequency power generators operating in the vicinity) and the latter generated inside the same logic system (for instance, due to mutual couplings among leads on which logic signals are conveyed). Generally, the manufacturers of digital integrated circuits characterize a logic family through two parameters: the static noise immunity and the dynamic noise family.

The static noise immunity characterizes the behavior of a logic family disturbed by noise pulses which last longer than the average propagation delay time of such family; the static noise immunity defines the voltage levels which do not influence the logic state and is derived from the transfer function of the logic family.

The dynamic noise immunity characterizes the behavior of a logic family disturbed by noise pulses having a shorter duration than the signal propagation delay time of such family. In this case, the energy of the noise pulse (amplitude and duration) determines whether a change of the output logic state will take place.

The dynamic noise immunity is a function of the logic swing of the family and therefore varies according to such swing. Generally, for each family of gates, the manufacturers provide two typical boundary characteristics for the dynamic noise; the former refers to noise pulses disturbing an input logic level "1"; the latter refers to noise pulses disturbing an input logic level "0". Such characteristics are determined by the manufacturers through the behavior testing of a suitable sample of the logic gates. Referring to a gate, each point of the dynamic noise boundary characteristic with gate inputs at logic level 0 (or 1 as the case may be) is obtained by applying to gate inputs a positive (or negative as the case may be) noise pulse having a predetermined duration x and by varying the pulse amplitude up to a level y at which the gate output changes its logic state. The point defined by abscissa x and ordinate y is a point of the boundary characteristic. However, it is clear that the so-obtained characteristics do not take into sufficient consideration the influence that a variation of the gate logic swing has on them. In fact, the logic swing varies as a function of: the temperature, the supply voltages, the aging, the load, and so on. Consequently, the dynamic noise immunity tends to vary.

At present, during the qualification phase of digital integrated circuits, only static immunity noise is generally tested. This is obtained through the use of complex equipment, mainly devoted to test the logic function of the integrated circuit, by applying the boundary voltage levels corresponding to logic 0 and 1 to the inputs of the circuit under test and checking the output voltage levels. An example of such equipment is provided in "Electrical Engineering in Japan" vol. 89, N. 8, 1969, pp. 45–53.

At present, a comprehensive procedure for the qualification of digital integrated circuit for dynamic noise is unavailable. Until now, the dynamic noise generated inside a system has been considered a negligible problem in comparison to that caused by external noise. However, there are some cases where the dynamic noise, due to the mutual coupling among leads, assumes a considerable importance, as for instance in those applications where long transmission lines are required between the source of digital signals and the receiver.

Referring specifically to a digital transmission system, the system immunity to the dynamic noise is generally established at design level by providing in the receiving circuits some integration capacitors which increase the propagation delay time of the receiving circuit. However, these limit the operative rate of the system.

There are some cases where such limit is unacceptable, as for instance in case of very large printed circuits on which a very fast logic unit is built and where a considerable electromagnetic coupling may exist among very long leads on which logic information is conveyed. In such a situation, in order to have a high reliability of the logic system, it is necessary to qualify the used integrated circuits as to the dynamic noise, that is, to make sure that they have a predetermined dynamic noise immunity, which may be specified by the manufacturers and based on design rules generally used by engineers when designing logic systems.

A method for qualifying a digital integrated circuit as to the dynamic noise could consist in feeding the inputs with noise pulses having a predetermined amplitude and duration and then checking, by means of comparators, if the voltage pulses on the outputs of the circuit exceed a predetermined threshold corresponding to the maximum value for the logic level 0 or fall below a predeterminate threshold corresponding to the minimum voltage value for the logic level 1. In other words, the dynamic noise immunity in the presence of a predetermined minimum logic swing would be tested. However, as the duration of the output pulses approaches the propagation delay time of the digital integrated circuit under test (generally, it is a few nanoseconds) and at present, comparators having the required speed are not available on the market, it is very problematic to embody a testing apparatus operating according to the method described above.

SUMMARY OF THE INVENTION

The testing apparatus of the present invention avoids the above problems and allows the comparison, in a simple and inexpensive way, of the amplitude of the noise pulses present on the outputs of a digital integrated circuit under test with some predetermined voltage threshold corresponding to the boundary voltage values of the two logic levels. According to the invention, this is obtained by using as comparators some very fast logic gates belonging to the same logic family as the digital circuits to be tested. Each one of such gates receives on its inputs an output of the integrated circuit under test. The values of the threshold voltages which cause a change of the logic state on the gate output are varied by acting on the ground potential of the digital integrated circuit embodying such gates.

BRIEF DESCRIPTION OF THE DRAWINGS

The manner in which the apparatus of the present invention is constructed and its mode of operation can best be understood in light of the following detailed description together with the accompanying drawings in which like reference numbers identify like elements in the several figures and in which.

DESCRIPTION OF THE PREFERRED EMBODIMENT

Figure 1:
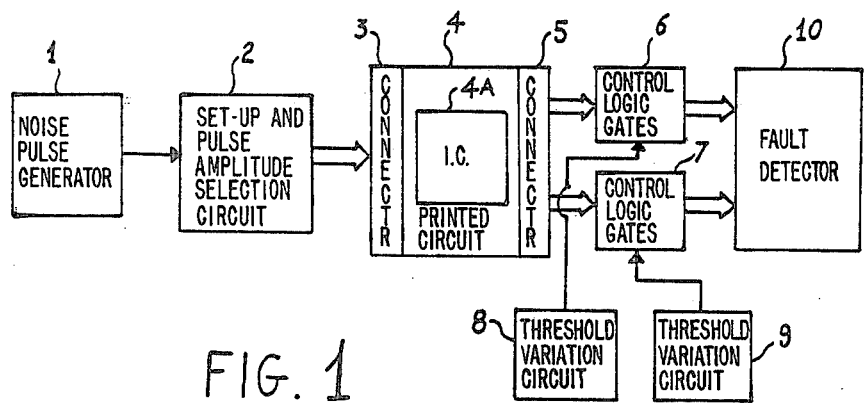
FIG. 1 shows in block diagram form the testing apparatus of the invention.

Referring to FIG. 1, it shows in block diagram form the testing apparatus of the invention. Such apparatus substantially comprises: a noise pulse generator 1; a circuit 2 for the setting and the noise pulse amplitude selection; two male connectors 3, 5 (for instance of pin type) on which a printed circuit 4 having two female connectors (not visible in FIG. 1), is, inserted, such printed circuit supporting an integrated circuit 4A to be tested; two groups 6 and 7 of control logic gates whose input voltage threshold are varied by circuits 8 and 9 respectively; and a circuit 10 for fault detection.

Before describing in detail the blocks constituting the testing apparatus of FIG. 1, it is preferable to review some considerations which will be useful in understanding the testing apparatus operation. For such purpose, FIG. 2 shows the boundary characteristics of dynamic noise immunity given a manufacturer for some TTL families to be tested by means of the apparatus of FIG. 1.

Figure 2:
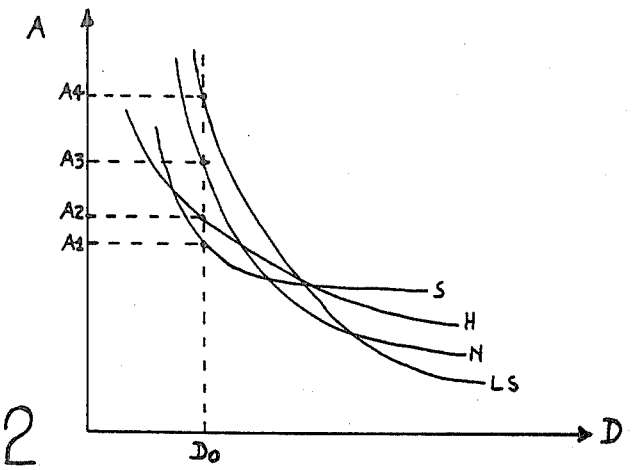
FIG. 2 shows the boundary characteristics of dynamic noise immunity given by the manufacturer for the several TTL families required to be tested by means of the apparatus of FIG. 1.

The characteristics of FIG. 2 refer to the case where a signal at logic level 0 on the inputs of a logic gate is disturbed by a positive noise pulse and define the amplitude and related duration of such noise pulse able to switch the logic level present on the output of such gate. The case represented by the characteristics of FIG. 2, that is, the case of dynamic noise superimposed on an input electrical signal corresponding to an input rated voltage equal to 0, is the most critical one. In fact, because most logic families are of the inverting type, the transition time of the output of a gate from logic level 1 (logic 0 on input) to logic level 0 (logic 1 on input) is shorter than the transition time of the output of the same gate from logic level 0 to logic level 1. In other words, as the voltage level on the output of a gate generally depends on the state of an output transistor, the time necessary for the output transistor to go from the cutoff state (gate output at logic level 1, that is gate inputs at logic level 0) to the saturation state (gate output at logic level 0, that is gate inputs at logic level 1) is shorter than the time necessary to the same output transistor for performing the opposite switching. This happens because the switching from ON to OFF at the output transistor is affected by a relatively long storage time.

Referring to FIG. 2, reference LS indicates the dynamic noise boundary characteristic of the TTL family of LS type circuits having a delay time from a logic 1 to 0 at the output of about 30 ns; reference N indicates the dynamic noise boundary characteristic of the TTL family of N type circuits having a delay time from a logic 1 to 0 at the output of about 15 ns; reference H indicates the dynamic noise boundary characteristic of the TTL family of H type circuits having a delay time from a logic 1 to 0 at the output of about 10 ns; reference S indicates the dynamic noise boundary characteristic of the TTL family of S type circuits having a delay time from a logic 1 to 0 at the output of about 5 ns.

Figure 3:
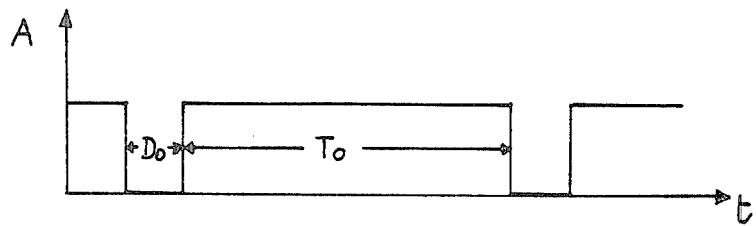
FIG. 3 shows the wave form of the voltage as output from the noise pulse generator belonging to testing apparatus of FIG. 1.

The sensitiveness to the dynamic noise of a TTL integrated circuit is tested through the apparatus of FIG. 1 by sending to the inputs of the circuit under test a series of noise pulses having a predetermined duration and an amplitude depending on the family type to which the circuit belongs and by checking the signal levels on the circuit outputs. In particular, selecting a noise pulse duration equal to D0, it is possible to obtain from the characteristics of FIG. 2 the pulse amplitudes A1, A2, A3 and A4 for families LS, N, H and S respectively. It is clear that such choice qualifies an integrated circuit to the dynamic noise on the grounds of the boundary characteristics given by the manufacturer. The several amplitudes of the noise pulses are obtained through the set up and selection circuit 2, which will be considered more in detail later on. The noise pulses, provided by generator 1 to circuit 2, have the shape shown in FIG. 3.

The pulse duration must be equal to the one selected in FIG. 2 and the interval T0 between a pulse and the successive one must be longer than (or at least equal to) the propagation delay time of the slowest integrated circuit to be tested. A detailed description of pulse generator 1 is omitted because pulse generators are well known in the art. For such purpose, the application refers to the application notes provided by the several manufacturers of digital integrated circuits. For example, generator 1 may be carried out by means of an astable multivibrator producing pulses of duration D0 and a counter producing the desired delay T0 between a pulse and the successive one. As duration D0 of pulses has to be equal to a few nanoseconds, the astable multivibrator may be carried out by means of a suitable number of very fast logic gates connected in cascade and looped. An example of very fast gates is given by the TTL family of F type circuits manufactured by Fairchild; it is also clear that the counter will have to belong to the same logic family.

Figure 4:
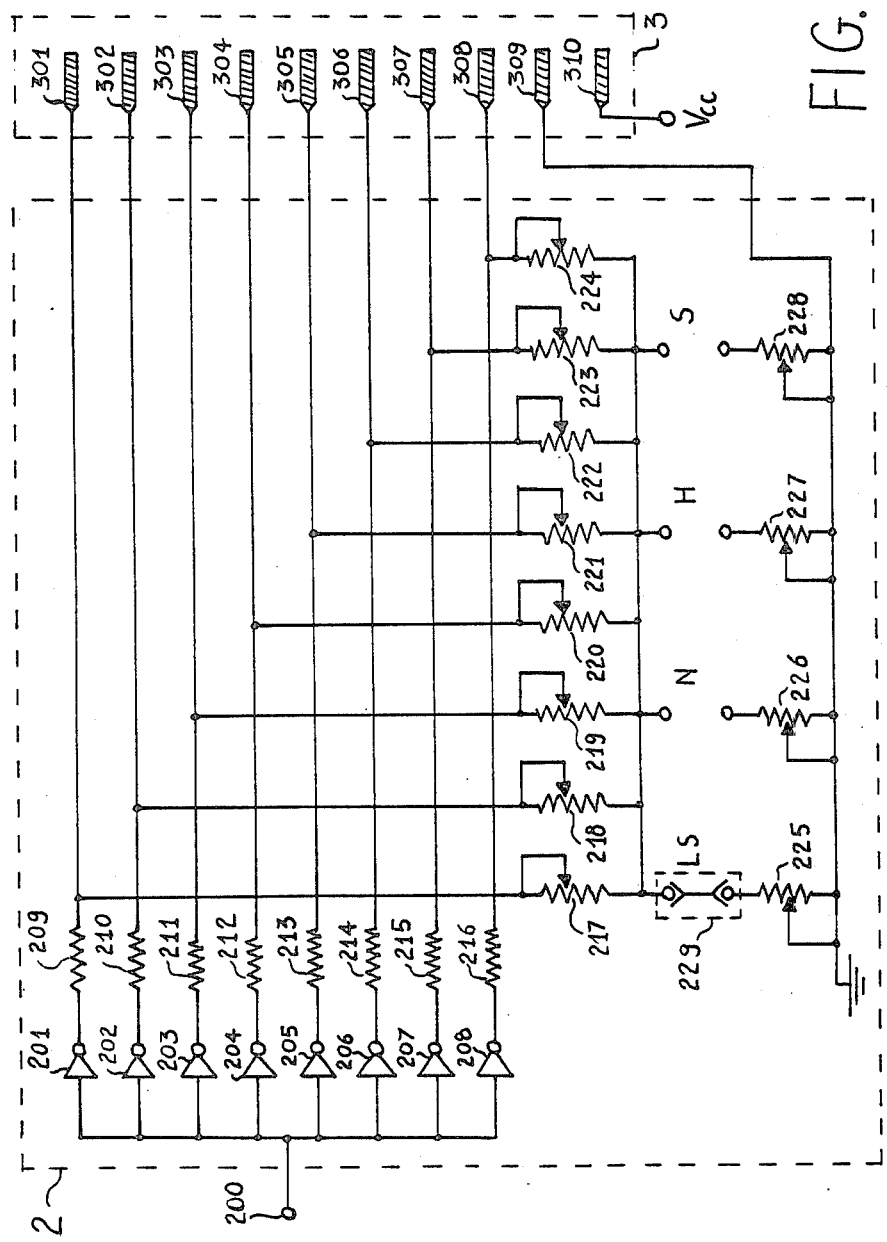
FIG. 4 shows in detail the set up and noise pulse amplitude selection circuit of the apparatus of FIG. 1.

FIG. 4 shows in detail circuit 2 for set up and noise pulse amplitude selection. Such circuit receives on input 200 the noise pulses shown in FIG. 3; such pulses are applied to the inputs of eight high speed NOT gates 201 through 208 (for instance, integrated circuits 74F04 manufactured by Fairchild. The outputs of NOT gates are loaded by voltage dividers; in particular NOT gate 201 (or 202 through 208) is loaded by the divider comprising a resistor 209 (or 210 through 216) and the resistor constituted by the series of a variable resistor 217 (or 218 through 224) and one of four variable resistors 225, 226, 227 228 selected through a jumper. Such jumper, outlined and referenced by 229, selects variable resistor 225 in FIG. 4. Variable resistors 217 through 224 have a common end point. However, each voltage divider may be considered virtually separate from the others because the value of the equivalent resistance in parallel with the selected resistor (one of resistors 225 through 228) is practically much greater than the resistance value of the selected resistor. The outputs of the several voltage dividers are applied to pin 301 through 308 of connector 3.

Owing to the allowances of the output voltage levels of NOT gates 201 through 208 and of the resistance values of the resistors constituting the several voltage dividers, the amplitudes of the noise pulses present on pins 301 through 308 of connector 3 are not in general equal. For such purpose, during the set up phase, by acting on variable resistors 217 through 224 it is possible to have on pins 301 through 308 pulses of equal amplitude and duration. Besides, during the set up phase, by acting on variable resistors 225 through 228 selected by jumper 229, it is possible to establish the amplitudes A1, A2, A3 and A4 of FIG. 2 for the several types of circuits to be tested. In particular, the amplitude A1 (A2, A3 or A4) for the TTL family of LS (N, H or S) type may be established by acting on variable resistor 225 (226, 227 or 228). Once the set up operations have been performed, it is possible to test a TTL family type by selecting the corresponding resistor by means of jumper 229.

It is important to point out the reason for which each of NOT gates 201 through 208 feeds through the related divider to only one pin of connector 3. As it will be seen later on, each of pins 301 through 308 is connected to an input of the integrated circuit to be tested. As an input capacitance is coupled to each input of an integrated circuit, it is clear that, if more than one input of the integrated circuit to be tested was driven by a single NOT gate, the load capacitance coupled to such NOT gate might assume a value that would increase considerably its propagation time and a non-negligible increase of duration D would occur. Pins 309 and 310 of connector 3 are respectively connected to ground and to a supply voltage source VCC and are devoted to provide the integrated circuit to be tested with the ground and the supply voltage.

Figure 5:
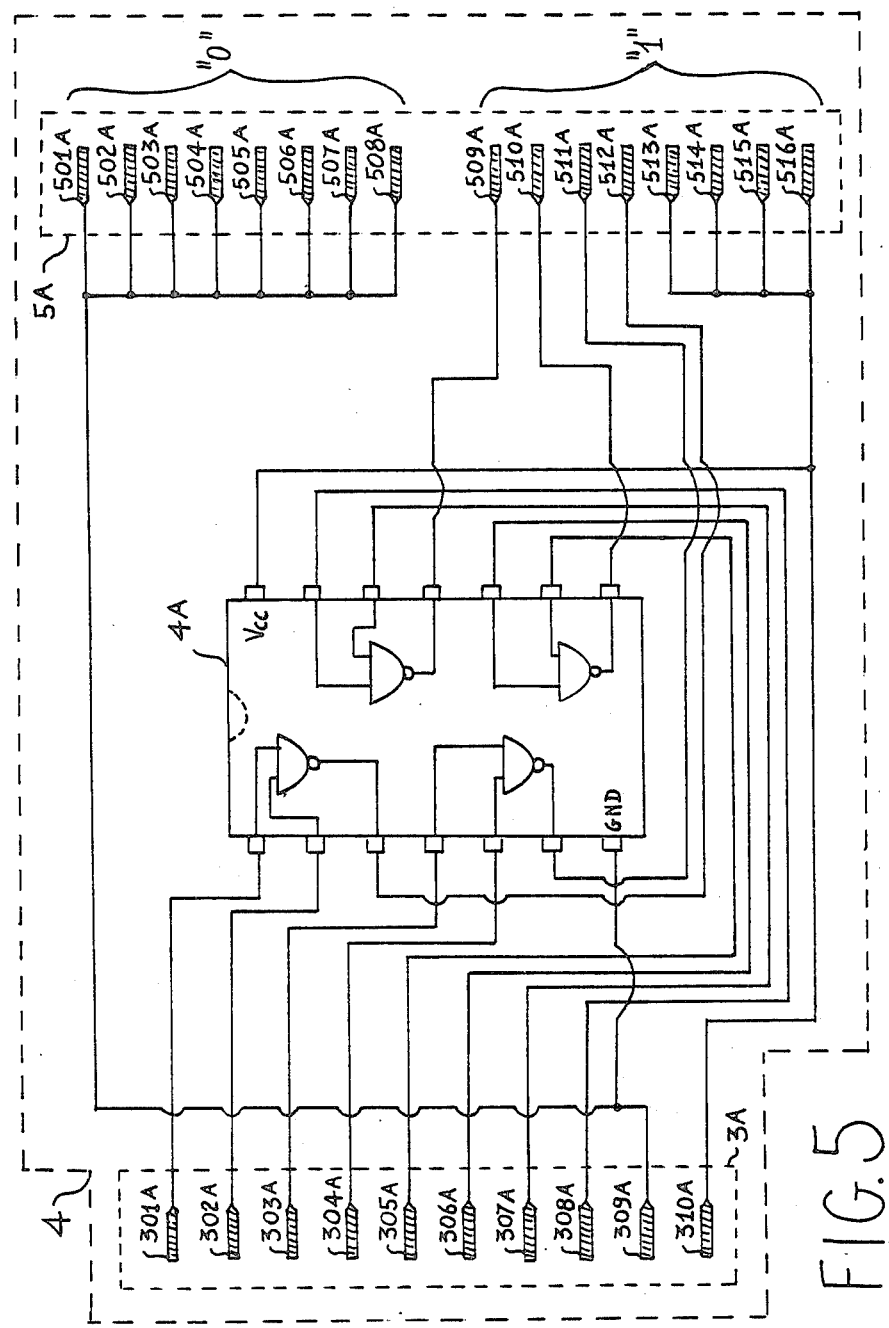
FIG. 5 shows by way of example the connections to be made for the inputs and outputs of a digital integrated circuit which has to be tested by means of apparatus of FIG. 1.

FIG. 5 shows an example of the connections to be made on a printed circuit 4 supporting an integrated circuit 4A to be tested. The integrated circuit 4A includes, for instance, four NAND gates. The printed circuit 4 may be engaged on the testing apparatus of the invention by means of two female connectors 3A and 5A. As shown in FIG. 5, when printed circuit 4 supporting integrated circuit 4A is engaged on apparatus of the invention, the noise pulses present on pins 301A through 308A of connector 3A are applied to the inputs of integrated circuit 4A. The outputs of circuit 4A are connected to as many pins of female connector 5A. It should be pointed out that connector 5A is provided with two groups of pins: a group "0" comprising pins 501A through 508A and a group "1" comprising pins 509A through 516A. A pin of group "0" must be connected to the tested circuit output which normally presents a logic level 0 when a signal at logic level 0 is applied to the corresponding inputs; a pin of group "1" must be connected to the tested circuit output which normally presents a logic level 1 when a signal at logic level 0 is applied to the corresponding inputs. Applying the above rule results in FIG. 5, where the outputs of the four NAND gates constituting circuit 4A are connected to as many pins of group "1". The pins of groups "0" and "1" which are not used must be connected to ground and to supply voltage respectively.

It is clear that if the logic of the integrated circuit to be tested changes, the connection leads on the printed circuit must also change. Having a number N of printed circuits which may be engaged on the apparatus of the invention, N types of different logic circuits may be tested. Besides, if each one of the N printed circuits is provided with a base on which the integrated circuit to be tested is inserted, it is possible to test individually in a simple and fast method each integrated circuit of a predetermined type.

Figure 6:
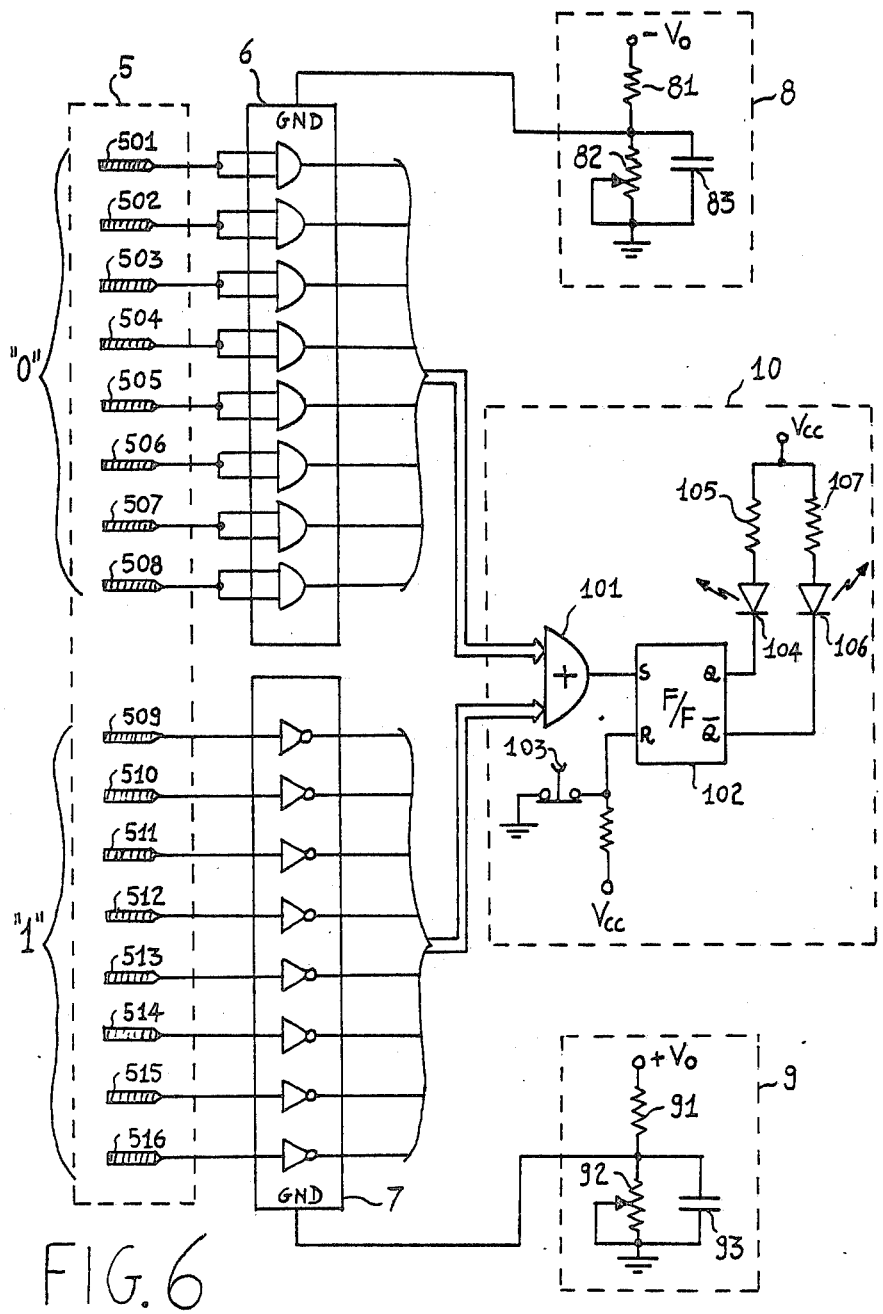
FIG. 6 shows in detail the control logic gates, the dynamic threshold variation circuit and the fault detector of apparatus of FIG. 1.

FIG. 6 shows in detail groups 6 and 7 of logic gates with related circuits 8 and 9 for dynamic threshold variation and circuit 10 for fault detection. Male connector 5 is provided with two groups of pins: a group "0" (pins 501 through 508) and a group "1" (pins 509 through 516) corresponding to groups of "0" and "1" of female connector 5A of FIG. 5, respectively. The pins of group "0" of connector 5 are connected to the inputs of group 6 including eight very fast AND gates belonging to the fastest TTL family to be tested, while the pins of group "1" of connector 5 are connected to the inputs of group 7 including eight very fast NOT gates also belonging to the fastest TTL family to be tested.

Gate group 6 may be, for instance, obtained by using 2 integrated circuits 74F08 of Fairchild, while gate group 7 may be obtained by using 4/3 of integrated circuits 74F04 manufactured by Fairchild. The input voltage levels for gate groups 6 and 7 are biased through circuits 8 and 9 respectively. In such a way, the noise margins of logic 0 and 1 for the voltage levels on the outputs of the integrated circuit to be tested may be fixed (respectively through the input voltage level variation of gate groups 7 and 6), that is, the logic swing for the circuit to be tested is fixed. Circuits 8 and 9 act on the ground potential of the packages embodying gate groups 6 and 7. Circuit 8 includes a divider of negative voltage $-V0$; such divider is formed by a fixed resistor 81 and a variable resistor 82, in parallel to which there is a capacitor 83 for divided voltage stabilization.

The divided voltage is applied to the ground pin of the integrated circuits embodying gate group 6. In a similar way, circuit 9 includes a divider of positive voltage $+V0$; such divider is formed by a fixed resistor 91 and a variable resistor 92, in parallel to which there is a capacitor 93 for divided voltage stabilization. The divided voltage is applied to ground pin of the integrated circuits embodying gate group 7. It is clear that, for a correct operation of the integrated circuits embodying gate groups 6 and 7, the ground potential variation must not exceed the limits imposed by the manufacturer. It is to be noted that the ground potential variation, besides the input voltage level of groups 6 and 7 affects the output voltage levels of them, too. However, the variations of such output voltage levels are negligible compared to the rated output voltage levels and therefore have no effect on the downstream logic circuits gate groups 6 and 7.

For the purpose of clarity, it is sufficient to describe the operations performed during the setting up phase in order to determine the desired maximum value V0M and the desired minimum value V1M, respectively, of the voltage threshold for the logic 0 and of the voltage threshold for the logic 1 on the outputs of the circuits to be tested, that is, in order to fix the boundary logic swing for such circuits.

Referring to AND gates of group 6, it is supposed that Vi0 is the maximum value of the input voltage corresponding to logic 0 and the Vi0 is less than V0M. A voltage V0M is applied to the inputs of AND gates of group 6 and then the ground potential of the integrated circuits embodying such gate group is varied until the outputs of AND gates rise to logic 1. In a similar way, referring to NOT gates of group 7, it is supposed that Vi1 is the minimum value of the input voltage corresponding to logic 1 and that Vi1 is greater than V1M.

A voltage V1M is applied to the inputs of NOT gates of group 7 and then the ground potential of the integrated circuits embodying such gate group is varied until the outputs of NOT gates rise to logic 1. The outputs of gate groups 6 and 7 are connected to as many inputs of a very fast OR gate 101.

The output of OR gate 101 is connected to the set (S) input of a flip-flop 102. The reset (R) input of flip-flop 102 generally is at logic level 0 and rises to logic level 1 when a key 103 is pressed. Output Q of flip-flop 102 is connected to the cathode of a LED diode 104, while output Q-bar is connected to the cathode of a LED diode 106. The anodes of diodes 104 and 106 are connected to supply voltage VCC through resistors 105 and 107, respectively.

It is clear that if the circuit under test works correctly (that is, none of its outputs presents voltage noise pulses having an amplitude greater than V0M, or lower than V1M, depending on whether such outputs are normally at logic level 0 or 1, respectively), the outputs of groups 6 and 7 are at logic level 0 and also the output of OR gate 101 is at logic level 0; so output Q (Q-bar) of flip-flop 102 is at logic level 0 (1). It follows that LED diode 104 is conducting and displays the correct working of the circuit under test. If, on the contrary, any of the outputs of the circuits under test presents voltage noise pulses having an amplitude greater than V0M, or lower than V1M, the output of the corresponding gate of group 6 or 7 rises to logic level 1 and also the output of OR gate 101 rises to logic level 1; so output Q (Q-bar) of flip-flop 102 goes to logic level 1 (0). It follows that LED diode 106 is conducting and displays the incorrect working of the circuit under test.

Several modifications can be made in the described testing apparatus without departing from the scope of the invention. For instance, the pin number of connectors, and therefore the number of circuits associated to the pins, may be increased or reduced according to the requirements.

While the invention has been shown and described with reference to the preferred embodiment thereof, it will be understood by those skilled in the art that the above and other changes in form and detail may be made therein without departing from the spirit and scope of the invention.

What is claimed is:

1. Apparatus for testing dynamic noise immunity of digital integrated circuits comprising:
   a generator of noise pulses of predetermined duration and amplitude, said pulses being applied to inputs of an integrated circuit under test;
   control logic means having inputs connected to outputs of said integrated circuit under test; and
   a fault detection means having inputs connected to outputs of said control logic means, said detection means displaying at least one of two possible working states of said integrated circuit under test;
   wherein said control logic comprises:
   a first group of logic gates having inputs connected to first outputs of said integrated circuit under test, said first outputs being normally at logic level 0;
   a second group of logic gates having inputs connected to second outputs of said integrated circuit under test, said second outputs being normally at logic level 1; and
   a circuit means coupled to said first and second group of logic gates and able to vary the input voltage thresholds of said first and second group of logic gates so as to fix a predetermined output logic swing for said circuit under test.

2. Apparatus as claimed in claim 1 wherein the variation of said voltage thresholds is obtained through said circuit means by varying the ground potential of an integrated circuit embodying said first and second group of logic gates.

3. Apparatus as claimed in claim 2 wherein said circuit means comprises variable voltage dividers.

* * * * *